(12) United States Patent
Walther et al.

(10) Patent No.: US 12,345,776 B2
(45) Date of Patent: Jul. 1, 2025

(54) EXTERNAL CONNECTOR AND SENSOR UNIT FOR WELDING EQUIPMENT

(71) Applicant: ESAB AB, Gothenburg (SE)

(72) Inventors: André Walther, Halle (DE); Volker Schauder, Halle (DE); Peter Budai, Almhult (SE); Magnus Persson, Kyrkesund (SE)

(73) Assignee: ESAB AB, Gothenburg (SE)

( * ) Notice: Subject to any disclaimer, the term of this patent is extended or adjusted under 35 U.S.C. 154(b) by 829 days.

(21) Appl. No.: 17/528,408

(22) Filed: Nov. 17, 2021

(65) Prior Publication Data

US 2022/0075003 A1   Mar. 10, 2022

Related U.S. Application Data

(62) Division of application No. 16/050,030, filed on Jul. 31, 2018, now Pat. No. 11,204,394.

(Continued)

(51) Int. Cl.
*G01R 31/42* (2006.01)
*B23K 9/095* (2006.01)
(Continued)

(52) U.S. Cl.
CPC .............. *G01R 31/42* (2013.01); *B23K 9/095* (2013.01); *B23K 9/0956* (2013.01); *B23K 9/1087* (2013.01); *G01R 31/40* (2013.01)

(58) Field of Classification Search
CPC ...... B23K 9/1087; B23K 9/0956; B23K 9/32; B23K 9/322; B23K 37/0294; B23K 9/1062; B23K 9/124; B23K 37/0247; B23K 9/095

(Continued)

(56) References Cited

U.S. PATENT DOCUMENTS

| 4,717,807 A | 1/1988 | Parks et al. |
| 5,436,427 A | 7/1995 | Bourque |

(Continued)

FOREIGN PATENT DOCUMENTS

| CN | 2860707 Y | 1/2007 |
| CN | 101977720 A | 2/2011 |

(Continued)

OTHER PUBLICATIONS

Communication Pursuant to Article 94(3) for European Patent Application No. 18779456.5 dated Feb. 8, 2024, 5 pages.

(Continued)

*Primary Examiner* — Phuong T Nguyen
(74) *Attorney, Agent, or Firm* — Edell, Shapiro & Finnan, LLC

(57) ABSTRACT

A connector and sensor unit for a welding apparatus, including a first port configured to be connected to a first welding cable of the welding apparatus, a second port configured to be connected to a second welding cable of the welding apparatus, current sensor circuitry configured to sense a current being supplied by the first welding cable and the second welding cable, and to output a corresponding current sense signal, voltage sensing circuitry configured to sense a voltage between the first welding cable and the second welding cable, and to output a corresponding voltage sense signal, and supply power circuitry configured to generate a predetermined voltage for at least the current sensor circuitry, wherein the supply power circuitry receives power from the first welding cable and the second welding cable via at least one inductor.

21 Claims, 7 Drawing Sheets

Related U.S. Application Data

(60) Provisional application No. 62/560,807, filed on Sep. 20, 2017.

(51) Int. Cl.
  *B23K 9/10* (2006.01)
  *G01R 31/40* (2020.01)

(58) Field of Classification Search
  USPC ...... 219/132, 130.1, 130.21, 130.32, 137.71, 219/137.7
  See application file for complete search history.

(56) References Cited

U.S. PATENT DOCUMENTS

| | | | |
|---|---|---|---|
| 6,040,555 | A | 3/2000 | Tiller et al. |
| 6,639,181 | B2 | 10/2003 | Suzuki et al. |
| 7,238,917 | B2 | 7/2007 | Stava et al. |
| 8,502,106 | B2 | 8/2013 | Ulrich et al. |
| 8,530,778 | B2 | 9/2013 | Halvorsen |
| 8,809,736 | B2 | 8/2014 | Fujiwara et al. |
| 9,302,339 | B2 | 4/2016 | Burkhart et al. |
| 2007/0051714 | A1 | 3/2007 | Ou |
| 2008/0264916 | A1 | 10/2008 | Nagano et al. |
| 2011/0309062 | A1* | 12/2011 | O'Donnell ............. B23K 9/125 219/130.1 |
| 2012/0152923 | A1 | 6/2012 | Sickels et al. |
| 2014/0001169 | A1 | 1/2014 | Enyedy et al. |
| 2014/0263256 | A1* | 9/2014 | Rappl ................... B23K 9/124 219/137.71 |
| 2016/0158869 | A1 | 6/2016 | Trinnes et al. |
| 2016/0175963 | A1 | 6/2016 | Denis |
| 2016/0175970 | A1 | 6/2016 | Denis |
| 2016/0175974 | A1 | 6/2016 | Denis |
| 2017/0021441 | A1 | 1/2017 | Simioni et al. |
| 2017/0021444 | A1 | 1/2017 | Simioni et al. |
| 2017/0129036 | A1 | 5/2017 | Christopher et al. |

FOREIGN PATENT DOCUMENTS

| | | |
|---|---|---|
| CN | 104582889 A | 4/2015 |
| EP | 0288991 A2 | 11/1988 |
| WO | 2017083299 A1 | 5/2017 |

OTHER PUBLICATIONS

International Search Report and Written Opinion for International Application No. PCT/IB2018/056941 mailed Jan. 2, 2019, 9 pages.
Office Action for Chinese Patent Application No. 201880060921.3 dated Apr. 2, 2021 with English translation, 31 pages.
Office Action for Canadian Patent Application No. 3,074,602 dated Jun. 22, 2021, 5 pages.

* cited by examiner

EXTERNAL CONNECTOR AND SENSOR UNIT FOR WELDING EQUIPMENT

This application is a Divisional of U.S. application Ser. No. 16/050,030, field Jul. 31, 2018, which claims the benefit of U.S. Provisional Application No. 62/560,807, filed Sep. 20, 2017, both of which are incorporated herein by reference in their entireties.

TECHNICAL FIELD

Embodiments described herein are related to a multifunction or combination connector and sensor unit, methods of powering the connector and sensor unit from welding voltages, and communicating parameters detected thereby to a communications unit.

BACKGROUND

A power supply is a basic part of a welding apparatus in that it is configured to supply the necessary electric arc that is critical to welding. Depending on the method of electric welding, the power supply may deliver electric power according to different parameters. An output voltage of a welding power supply is set to levels defined by the needs of the welding method selected, safety requirements and an effectiveness of the apparatus. As a rule, a maximum voltage output by the power supply is far too low to cause electric breakdown from a working electrode to a workpiece at usual operating distances. Therefore, the start of welding operation may commence in a "contact" manner. That is, the welding is initiated upon direct contact of a working electrode and the workpiece. After an activation of the power supply, when a certain current flows out of the power supply, an arc is ignited between the electrode and the workpiece. Alternatively to the contact method, welding may begin without contact between the electrode and the workpiece. In this alternative case, the welding apparatus comprises an auxiliary device, which, for a short time, delivers a high frequency increased voltage sufficient to cause electric breakdown between the electrode and the workpiece and thus start the electric arc and the welding process.

In view of the different possible states of the welding process, it is often desirable to monitor and track various parameters such as voltage, current, and/or any number of other welding or associated parameters.

BRIEF SUMMARY

A connector and sensor unit for a welding apparatus in described herein and includes a first port configured to be connected to a first welding cable of the welding apparatus, a second port configured to be connected to a second welding cable of the welding apparatus, current sensor circuitry configured to sense a current being supplied by the first welding cable and the second welding cable, and to output a corresponding current sense signal, voltage sensing circuitry configured to sense a voltage between the first welding cable and the second welding cable, and to output a corresponding voltage sense signal, and supply power circuitry configured to generate a predetermined voltage for at least the current sensor circuitry, wherein the supply power circuitry receives power from at least one of the first welding cable and the second welding cable and via at least one inductor.

DETAILED DESCRIPTION

Figure 1A:
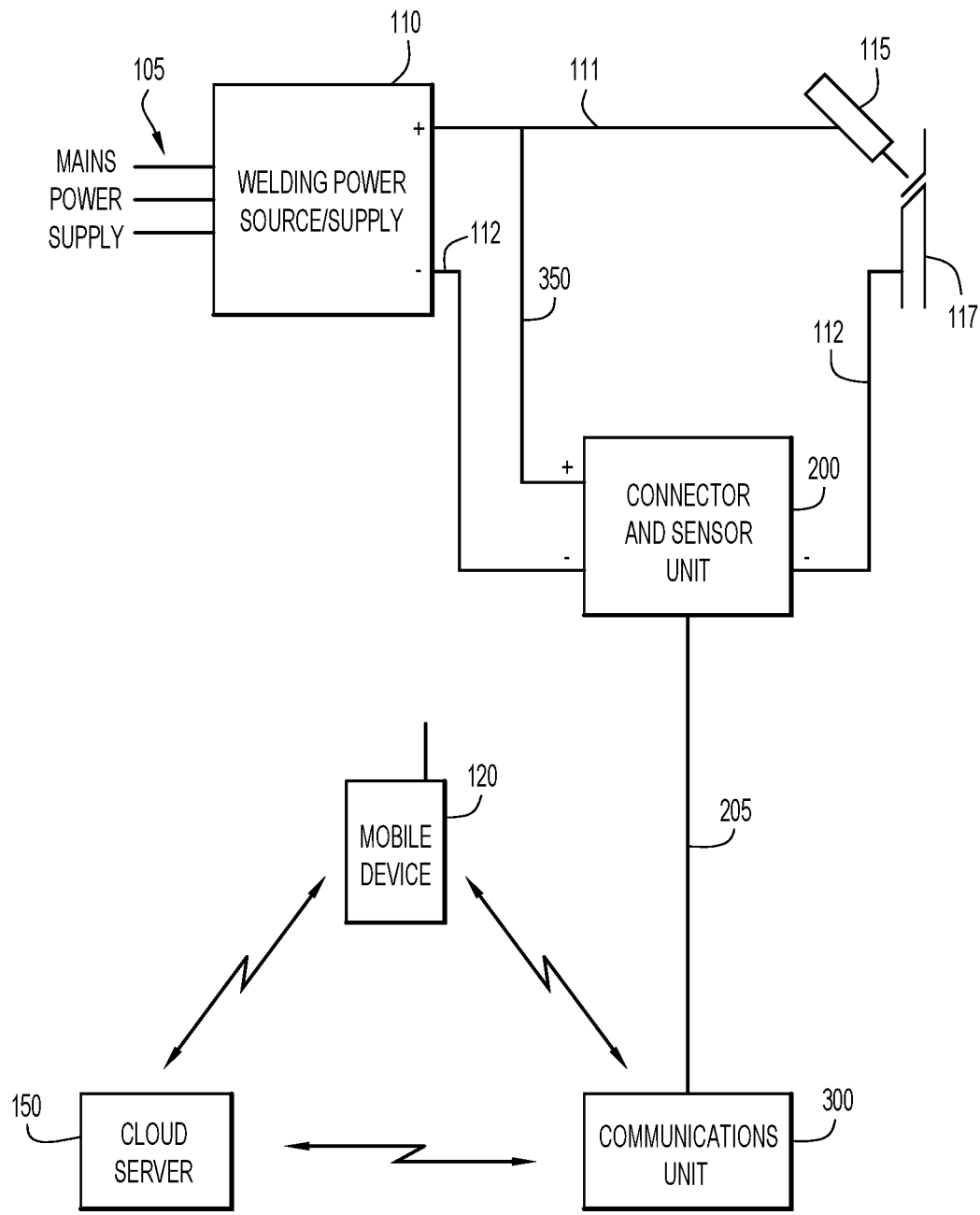
FIG. 1A depicts a block diagram of an arrangement for a welding apparatus, including a connector and sensor unit, and loopback connection, in accordance with an example embodiment.

FIG. 1 depicts a block diagram of an arrangement for a welding apparatus, including a connector and sensor unit 200, and a loopback connection, in accordance with an example embodiment. As shown in the figure, mains power supply 105 supplies electric power to welding power source 110. Welding power source 110 may also be referred to herein as a welding "power supply" 110. Power supply 110 provides connections for two cables or leads 111 and 112, respectively providing plus and minus welding voltages. These cables may also be referred to herein as "first" and "second" welding cables, and the "first" welding cable may be the plus welding voltage cable or the minus voltage welding cable, and the "second" welding cable would then be the other of the plus or minus voltage welding cable. For ease of description, the "plus" and "minus" voltage cable or lead terminology is employed herein, but those skilled in the art will appreciate that such terminology should not be considered to limit the scope of the invention. For example, the respective welding cables may deliver AC welding power and, as such, "plus" and "minus" designations may not have any particular relevance. The plus voltage cable 111 may be connected to a welding torch 115. The minus voltage cable 112 may be connected to a workpiece 117 via a connector and sensor unit 200, which, at a high level, provides selected power supply sensing functions and connectivity to a communications unit 300, via cable 205, that enables wireless communication with, e.g., a mobile device 120 and/or a remote or cloud server 150. In the embodiment of FIG. 1A, loopback connection 350 (discussed later herein) provides a plus voltage signal to connector and sensor unit 200 such that plus voltage cable 111 does not itself need to pass through connector and sensor unit 200.

Figure 1B:
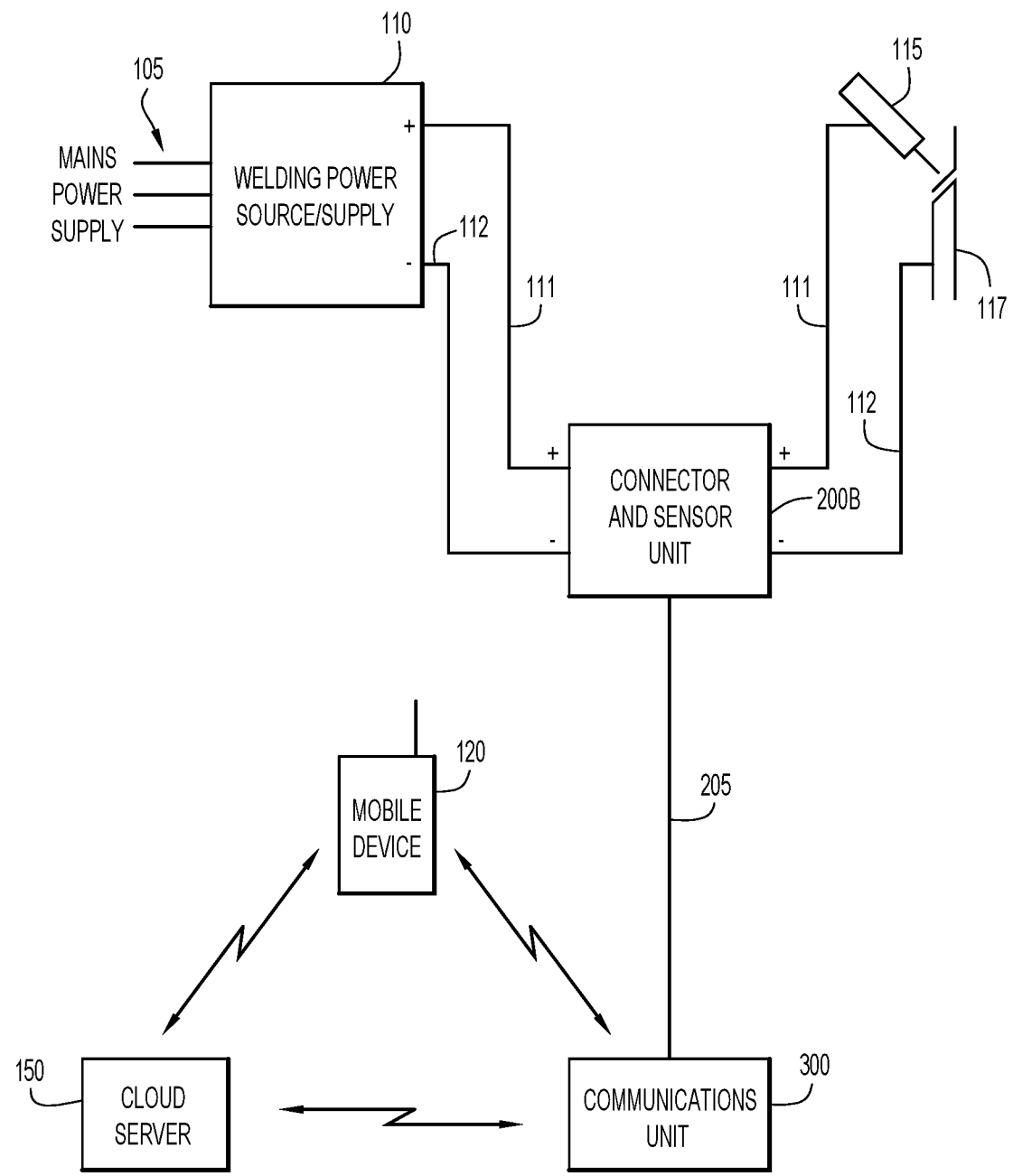
FIG. 1B depicts a block diagram of an arrangement for a welding apparatus, including a connector and sensor unit, without a loopback connection, in accordance with an example embodiment

In an alternative embodiment, as shown in FIG. 1B, loopback connection 350 is eliminated, and plus voltage cable passes through connector and sensor unit 200B.

In an embodiment, connector and sensor unit 200 derives power from plus and minus leads 111, 112 of welding power supply 110. That is, one function of the connector and sensor unit 200 is to provide a steady, e.g., 5 volt DC, supply of power to power circuitry within the connector and sensor unit 200, and to power, at least, circuitry within communications unit 300 so that, together, the connector and sensor unit 200 and communications unit 300 can perform measurement, calculation, storage, compilation and/or communication functions. An issue with obtaining power from the welding cables 111, 112, however, is that a voltage between those cables may be on the order of 5-120 volts and there might also be, periodically, high frequency (HF) and high voltage (HV) signals that are used for arc ignition. In bleeding power away from welding cables 111, 112, it is important not to disrupt or otherwise distort the voltage signals on welding cables 111, 112 as such distortion may detrimentally impact the ability of the welding apparatus to achieve the desired welding functionality (e.g., arc ignition).

As will be explained further below, connector and sensor unit 200 may be connected to welding cables 111, 112 via inductors (operating as RF chokes) to ensure that, e.g., HF high voltage signals that might be present on the leads 111, 112, and that are meant to be applied at the torch worksite, are not problematically impacted.

In an embodiment, connector and sensor unit 200 senses or monitors several parameters regarding the state of welding power supply 110 (as well as other possible parameters) and, via link 205, passes signals indicative of the sensed states to communications unit 300. The signals may be provided in analog or in digital and/or packetized form. Communications unit 300 may then (digitize/packetize and) share that information with applications running on mobile device 120 and/or cloud server 150. Communications unit 300 may communicate with mobile device 120 and/or cloud server 150 via well-known short range wireless communication protocols such as Bluetooth™ or wireless fidelity (WiFi), or well-known cellular communication standards.

In an embodiment, connector and sensor unit 200 is provided with an Internet Protocol (IP) address that is associated with cloud server 150. The IP address may be supplied by a user, via, e.g., mobile device 120, to communications unit 300. Data collected by connector and sensor unit 200 and supplied to communications unit 300 may then be transmitted to cloud server 150, via an internet connection, for storage and analysis. The amount of data stored with respect to each weld may be dependent on how much information is entered by a user, and a number of sensors attached to, or are provided within, the connector and sensor unit 200. A welding time may also influence the amount of data created and stored. In one implementation, after each weld (or during a given welding operation), measured values (e.g., one or more values per second) together with entered information provided prior to welding (e.g., entered via mobile device 120) is automatically sent to the cloud server 150.

In an embodiment, each connector and sensor unit 200 has a unique identification number and/or serial number (that it is selected, e.g., at manufacturing). That identification information may be sent along with any data to ensure that data associated with a given welding machine or user is kept together. An application on mobile device 120 may be configured to receive still other user inputted information that can be bundled together with measured data for each weld and stored in the cloud server 150. Examples of such other information include welding equipment, power source, wire feeder type, welder, work object or workpiece, type of weld joint, and weld seam in a multi-seam weld joint, among other possible information. Cloud server 150 may respond back to mobile device directly, or via communications unit 300, with, e.g., work tips, or other feedback regarding welding, maintenance, etc.

Figure 2A:
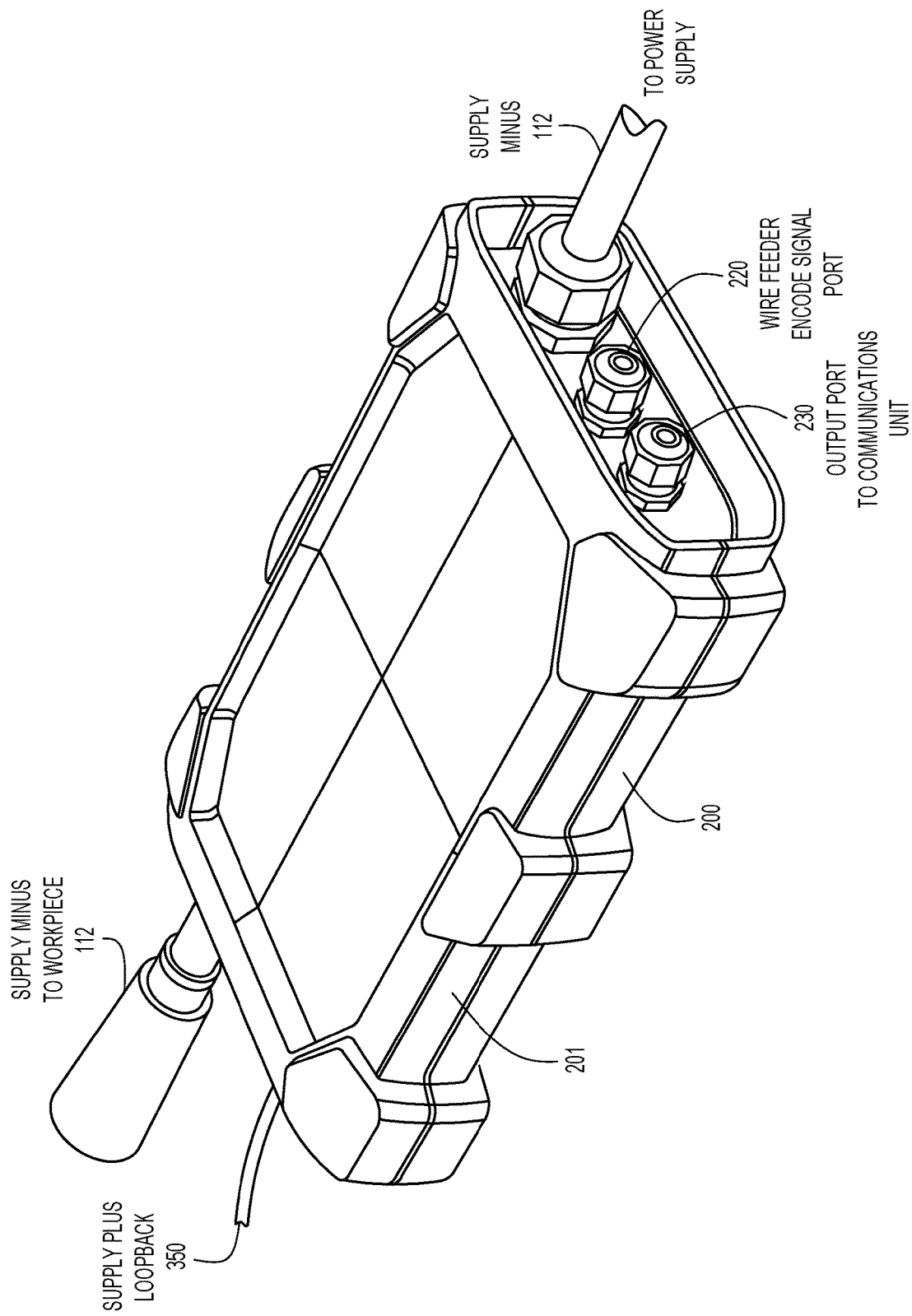
FIG. 2A depicts a perspective drawing of a connector and sensor unit in accordance with an example embodiment.
Figure 3:
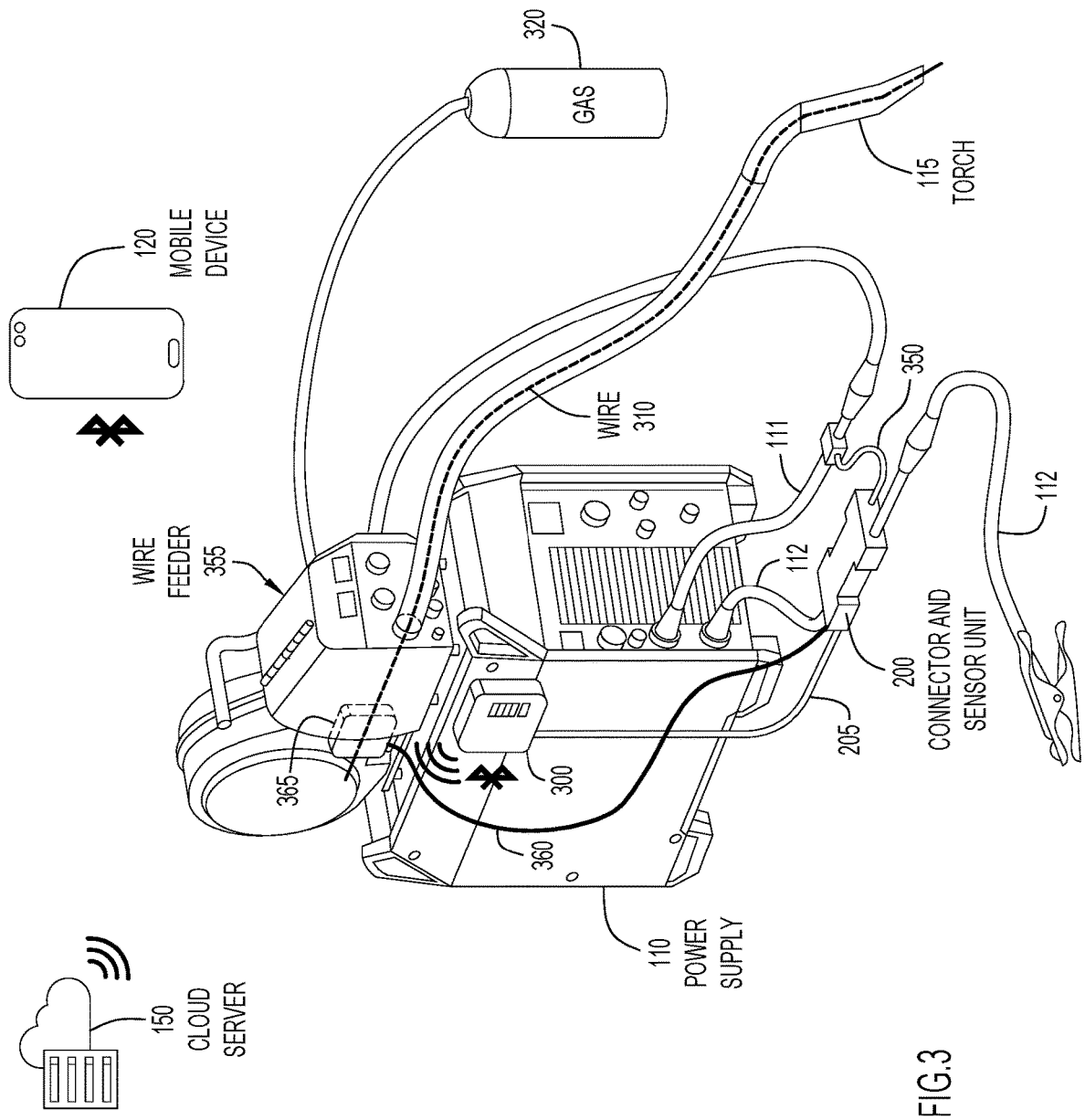
FIG. 3 depicts a more detailed arrangement for a welding apparatus including a connector and sensor unit in accordance with an example embodiment.

FIG. 2A depicts a perspective drawing of the connector and sensor unit 200 in accordance with an example embodiment. In FIG. 2A, connector and sensor unit 200 may comprise a metal or hard plastic enclosure 201 that is configured to withstand typical welding shop environment handling. Connector and sensor unit 200 includes several ports through which, and from which, electrical (analog or digital) signals can pass. Reference may also be made to FIG. 3, which depicts a more detailed arrangement for a welding apparatus in accordance with an example embodiment including connector and sensor unit 200.

In the depicted embodiment of FIG. 2A, which should not be construed as limiting, towards the upper left side of the figure there are two ports (not visible in FIG. 2A, but visible in FIG. 3). One port receives the plus power supply welding voltage from the power supply 110 via loopback connection 350, and the other port is arranged with a coupler to output the minus supply voltage 112 that is to be connected to a workpiece.

The visible ports in FIG. 2A towards the right hand side of the drawing include a port to receive the minus supply welding voltage 112 from the power supply 110, a port 220 to receive a wire feeder encode signal, and a port 230 to output several signals to the communications unit 300. Port 230 may be a multi-pin port to accommodate multiple different signals and a power supply.

Figure 2B:
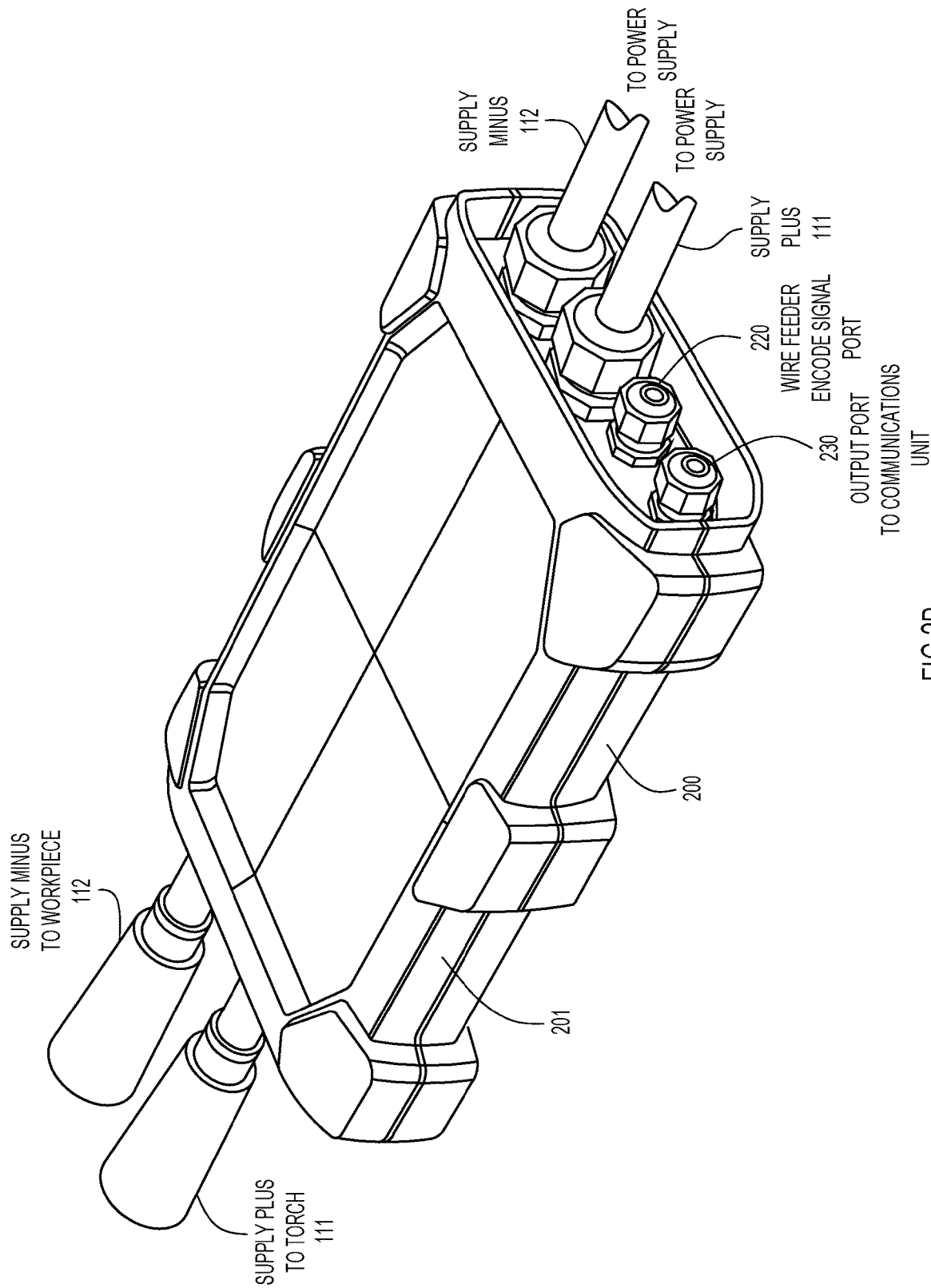
FIG. 2B depicts a perspective drawing of a connector and sensor unit through which the welding cables pass in accordance with an example embodiment.

FIG. 2B depicts a perspective drawing of a connector and sensor unit 200B through which the welding cables 111, 112 pass in accordance with an example embodiment. FIG. 2B is consistent with FIG. 1B where loopback connection 350 is eliminated.

The description hereafter focuses primarily on the embodiments depicted in FIGS. 1A and 2A, i.e., the embodiments including loopback connection 350. However, those skilled in the art will appreciate that the features described hereinafter may be equally applicable to the embodiments depicted in FIGS. 1B and 2B.

Figure 4:
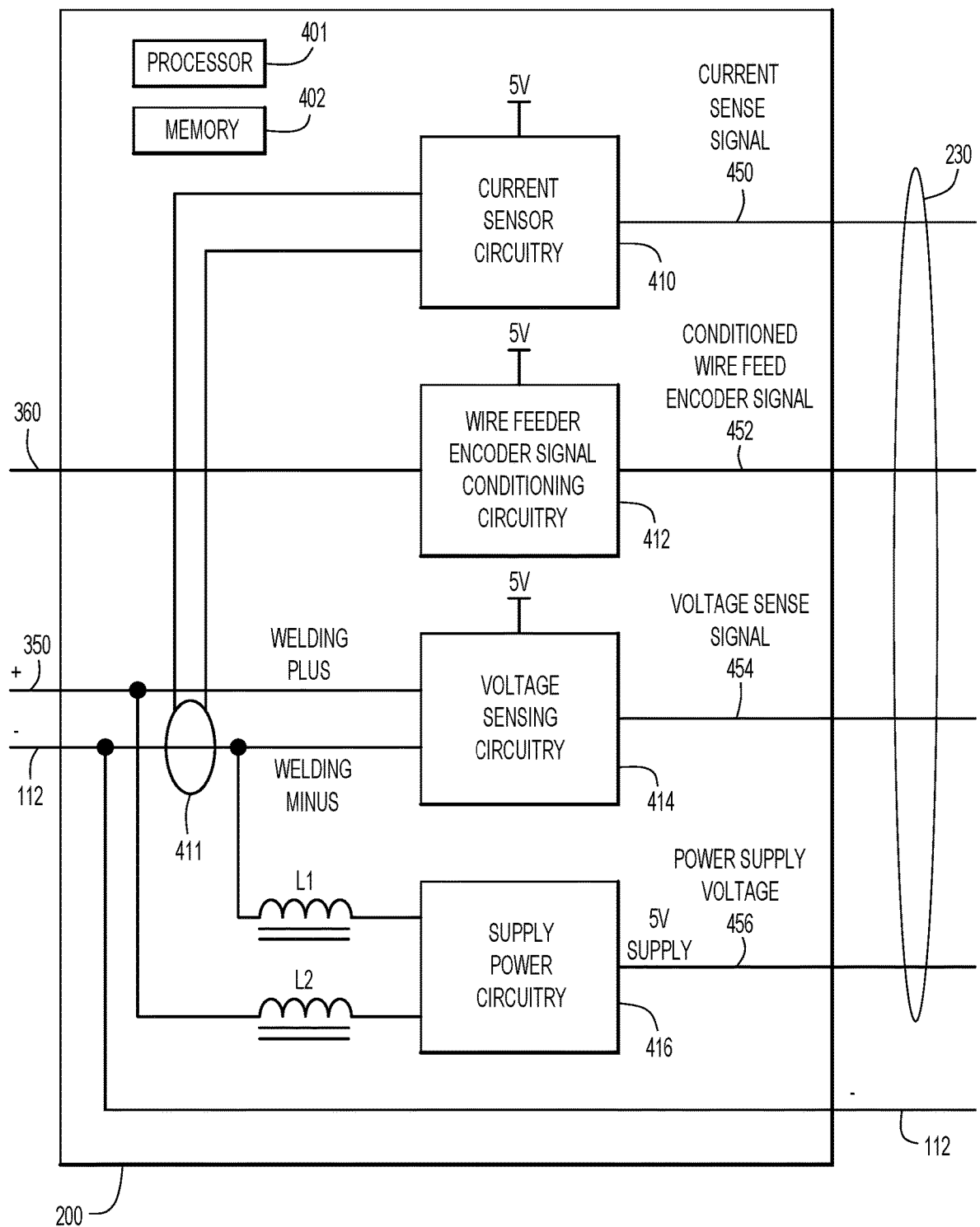
FIG. 4 depicts a block diagram of circuitry that may be deployed in the connector and sensor unit in accordance with an example embodiment.

As noted, FIG. 3 depicts a more detailed arrangement for a welding apparatus in accordance with an example embodiment. FIG. 3 shows, practically, how the connector and sensor unit 200 is connected to the power supply 110 and communications unit 300. It is noted that FIG. 3 depicts an arrangement for a MIG (metal inert gas) welding process, but the embodiments described herein are applicable to other welding processes as well, including, but not limited to, TIG (tungsten inert gas) welding, and stick welding processes. As shown, connector and sensor unit 200 is configured to receive power supply 110 minus voltage cable 112 and pass the minus voltage signal to an output port. As is seen in FIG. 4, in accordance with one possible implementation, minus voltage cable 112 is used to sense the amount of current being drawn or supplied by power supply 110. Connector and sensor unit 200 also receives the plus voltage from the power supply 110 via a loopback cable 350 connected to plus voltage cable 111. In the embodiment in which plus voltage cable 111 passes through the connector and sensor unit 200B, plus voltage cable 111 could alternatively be used to sense the amount of current being drawn or supplied by power supply 110.

A wire feeder 355 is also shown in FIG. 3. In accordance with one embodiment, a separate wire feeder encoder 365 is provided and through which welding wire is passed to monitor, e.g., wire speed or wire amount used. In the embodiment shown in FIG. 3, cable 360 supplies a wire feeder encoder signal from the wire feeder encoder 365 to the wire feeder encode signal port 220 of connector and sensor unit 200. Cable 360 may also supply power to the wire feeder encoder 365 that is generated within connector and sensor unit 200.

Finally, cable 205 is used to connect output port 230 on connector and sensor unit 200 and communications unit 300. Cable 205 is used to carry signals indicative of one more states of parameters related to the power supply 110, among other possible signals, and to provide power to communications unit 300. In an embodiment, communications unit 300 is mounted on power supply 110 via magnets, hook and loop tape or a strap. Since the communications unit 300 includes a radio transmitter/receiver, it is advantageous to position the communications unit 300 as high as practicable. In an embodiment, communications unit 300 includes a rechargeable battery or charge capacitor (not shown), which is recharged by power supplied by connector and sensor unit 200. Such a battery or charge capacitor (power storage device) enables the communications unit 300 to operate, at least for a period of time, even when no power is supplied from power supply 110.

Also shown in FIG. 3 are a gas bottle 320 that feeds appropriate gas to torch 115 and wire 310 that is being fed from wire feeder 355. Still also shown in FIG. 3 are mobile device 120 and cloud server 150. In one embodiment, communications unit 300 communicates received information from connector and sensor unit 200 to mobile device 120 via, e.g., Bluetooth, and/or to cloud server 150 via WiFi (or mobile telephony protocols).

FIG. 4 depicts a block diagram of circuitry that may be deployed in the connector and sensor unit 200 in accordance with an example embodiment. As shown, connector and sensor unit 200 includes three inputs and two outputs, in the example embodiment. The inputs include ports for the plus and minus welding voltages via cable 112 and loopback 350, and wire feeder encoder signal via cable 360 and port 220. The outputs include the minus welding voltage 112 and a plurality of signals available at port 230. Those skilled in the art will appreciate that more or fewer ports may be provided in connector and sensor unit 200. Also, for simplicity, only one signal wire is shown being output for each of the several components 410, 412, 414, 416 described below, but those skilled in the art will appreciate that each output might also include a corresponding ground signal, or might include still other associated wires/signals.

Circuitry that generates the plurality of signals available at port 230 is described below. Current sensor circuitry 410 is provided to sense an amount of current flowing through welding cables 111, 112 by using a current sensor 411 that encircles, e.g., minus welding voltage cable 112 (or, possibly, the plus welding voltage cable 111 in the non-loopback connection embodiment). A signal from current sensor 411 is supplied to current sensor circuitry 410 which outputs a corresponding current sense signal 450, which may be a voltage signal indicative of the amount of current flowing in the cable 112.

Wire feeder encoder signal conditioning circuitry 412 receives the wire feeder encoder signal and applies appropriate normalization, or voltage conditioning, and outputs a corresponding conditioned wire feeder encoder signal 452. Wire feeder encoder signal conditioning circuitry 412 may, for example, include optical isolation circuitry to isolate the input and output thereof.

Voltage sensing circuitry 414 senses the voltage between plus and minus welding cables 111, 112 and outputs a corresponding voltage sense signal 454.

Supply power circuitry 416 receives power from the plus and minus welding voltages 111 (350), 112 and converts the same to, e.g., a 5 volt DC voltage. That DC voltage is used within connector and sensor unit 200 (i.e., the voltage provides power to, e.g., current sensor circuitry 410, wire feeder encoder signal conditioning circuitry 412, and/or voltage sensing circuitry 414) and is also output as power supply voltage 456 that is supplied to communications unit 300 so that communications unit 300 has the necessary power to operate. Power supply voltage 456 may also be supplied to cable 360 to power wire feeder encoder 365. By generating and supplying power from the welding voltages, power is available within connector and sensor unit 200 and can be made available to the wire feeder encoder 365, and the communications unit 300 to recharge a battery therein.

In one embodiment, signals 450, 452, 454 and voltage supply 456 are provided directly to communications unit 300, without further processing, e.g., in an analog format.

In another embodiment, processor 401 and memory 402 may also be provided and used to, e.g., generate, and/or process, e.g., signal 450, 452, and/or 454 prior to transmitting the same to communications unit 300. More specifically, memory 402 may be used to store logic instructions (e.g., software or firmware) that, when executed by processor 401, enable any of the circuitry shown in the connector and sensor unit 200 to be configured or operated. The software or firmware (or adequate hardware circuits) can also be used to analog-to-digital convert, bundle and/or packetize one or more of the several signals, generated by connector and sensor unit 200, with, e.g., identification information of the connector and sensor unit 200. Resulting bundles of data or packets may then be passed to communications unit 300 via port 230. In one embodiment, connector and sensor unit 200 may include a user interface, e.g., a display (not shown), and processor 401 and memory 402 may execute/store instructions that enable the user interface to provide information to a user, e.g., voltage, current, and/or wire feeder parameter values. In the embodiments depicted now such user interface is shown. In general, connector and sensor unit 200 may perform no processing using a processor, or may perform processing using a processor such as processor 401.

Analog-to-digital converting, bundling and packetizing may also be performed partly or fully in communications unit 300, which preferably has its own processor and memory (not shown).

In one possible embodiment, connector and sensor unit 200 and communications unit 300 are integrated into a single physical unit. However, separation of the connector and sensor unit 200 and communications unit 300 from each other, i.e., separate and apart from each other as is depicted herein, may be more desirable in order to avoid radio frequency (RF) interference to the communications unit 300 caused by the possibly noisy high voltage and current passing through the connector and sensor unit 200, and also in order to enable the communications unit 300 to be positioned as high as possible to improve wireless connectivity.

In still another embodiment, gas usage rate, or gas volume data can also be provided to communications unit 300 via connector and sensor unit 200, or directly through other (wireless or wired) means. Such data can also be supplied to cloud server 150.

In an embodiment, processor 401 (or a processor in communications unit 300) may be a simple programmable logic device (SPLD), complex programmable logic device (CPLD), field programmable gate array (FPGA), microprocessor, or application specific integrated circuit (ASIC) that is configured to execute the logic instructions stored in memory 402.

Memory 402 (or a memory in communications unit 300) may be implemented as non-transitory computer readable media such as random access memory (RAM) or other dynamic storage device (e.g., dynamic RAM (DRAM), static RAM (SRAM), and synchronous DRAM (SD RAM)), read only memory (ROM) or other static storage device (e.g., programmable ROM (PROM), erasable PROM (EPROM), and electrically erasable PROM (EEPROM)).

As further shown in FIG. 4, supply power circuitry 416 may be fed power via two inductors L1 and L2, respectively connected to the plus and minus welding voltages cables 111 (350), 112. The inductors L1, L2 are configured such that a sufficient power may be drawn from the welding cables, while not significantly degrading the available power for welding functions, in particular any high frequency arc ignition voltages that may be present on the plus and minus welding voltage cables. Although two inductors are shown, it is possible that only one inductor or no inductors could be employed. In a single inductor case, the inductor may be disposed between the plus voltage welding cable 111 (350) and the supply power circuitry 416, or the minus voltage welding cable 112 and the supply power circuitry 416. Two inductors may be used to ensure that even if the welding cables are attached to connector and sensor unit 200 in a reverse way, HF ignition voltage waveforms are still steered toward torch 115, and not supply power circuitry 416.

Several parameters are taken into account to determine a value for inductors L1 and L2, including:
 The power supply requirement for the connector and sensor unit 200 and the communications unit 300;
 Available voltage range at the input (i.e., voltage between the welding cables);
 Output voltage of a voltage regulator of supply power circuitry 416; and
 Acceptable amount of damping that can be allowed of the HF ignition voltage generated by an ignition (auxiliary) device in the power supply 110 (e.g., 10%).

The parameters may be dependent on any one or more of the following interactions:
 Output power together with minimum input voltage defines the maximum current through the inductance windings;
 Minimum voltage in the voltage range together with the required output voltage and maximum current through the inductor defines maximum resistance of the inductance windings;
 The acceptable damping together with the internal impedance of the HF generator of the power source defines the necessary impedance of the inductance;
 Material of core and cross sectional area of the inductors define needed number of winding turns to achieve desired impedance;
 Geometry of inductor and number of turns of inductor wire; and
 Maximum resistance and length of wire together with material selection of wire determines the necessary diameter of the wire.

The following is an example in which supply power conditioning circuitry 416 is expected to supply 5 W of power to communications unit 300.

Assume the input voltage is 5-120 V between the welding cables, and the required output voltage from the supply power conditioning circuitry 416 is 5 V.

A 10% reduction of HF voltage is acceptable.

For this example, the interaction among the parameters is as follows:
 Maximum input current is 5 W/10 V=0.5 A.
 Maximum resistance of inductor winding is 5 V/0.5 A=10 ohm Assuming an impedance of 2 ohms for the internal impedance of the HF generator in the power supply 110, the necessary impedance for the inductor is 19 ohms. Since the inductor is symmetrical (two inductors: L1 and L2) the impedance attributed to each is 9.500 ohms. For a HF of 1 MHz this relates to an inductor with an inductance value of 1.5 mH.

Those skilled in the art will appreciate that other values of inductance may be used, resulting in different amounts of damping of the high frequency, high voltage waveforms. A range of permissible damping may be on the order of 0% up to 50%.

In a working prototype, inductor material was selected to avoid reduction of permeability due to DC current through the winding. However, less expensive material may also be selected to achieve the desired function. For the specific material selected, 100 turns were used for the winding.

With a core having a height of 15 mm, an outer diameter of 40 mm and an inner diameter of 23 mm, the length of 0.13 mm copper wire used was 4.8 m.

Figure 5:
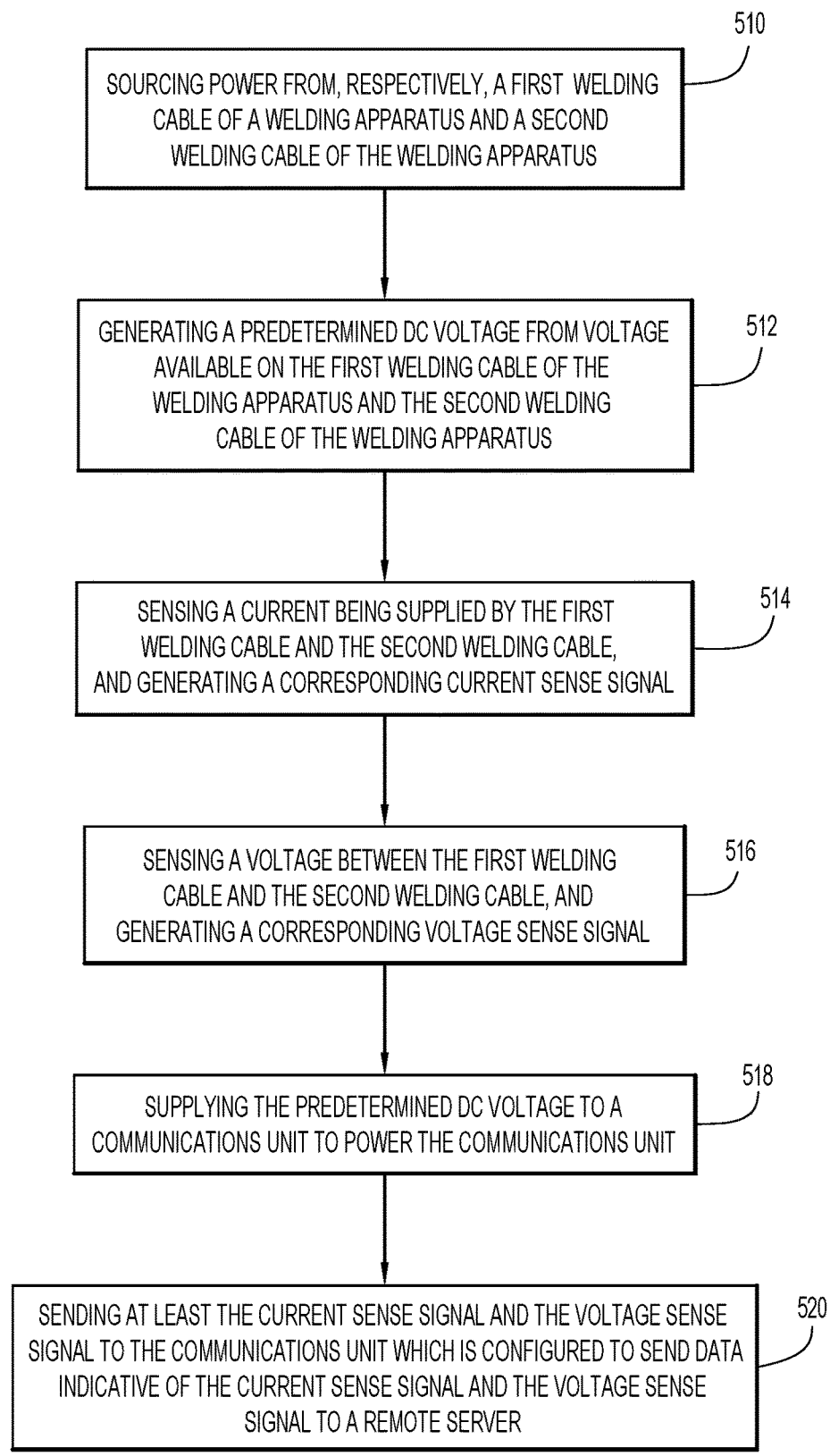
FIG. 5 depicts a flow chart of plurality of operations that may be performed by the connector and sensor unit in accordance with an example embodiment.

FIG. 5 depicts a flow chart of plurality of operations that may be performed by the connector and sensor unit 200 in accordance with an example embodiment. At 510 the connector and sensor unit is configured to source power from, respectively, a first (e.g., a plus voltage) welding cable of a welding apparatus and/or a second (e.g., a minus voltage) welding cable of the welding apparatus. At 512, the connector and sensor unit is configured to generate a predetermined DC voltage from voltage available on the first welding cable of the welding apparatus and the second welding cable of the welding apparatus. At 514, the connector and sensor unit is configured to sense a current being supplied by the first welding cable and/or the second welding cable, and generate a corresponding current sense signal. At 516, the connector and sensor unit is configured to sense a voltage between the first welding cable and the second welding cable, and generate a corresponding voltage sense signal. At 518, the connector and sensor unit is configured to supply the predetermined DC voltage to a communications unit to power the communications unit, or power storage device therein. And at 520, the connector and sensor unit is configured to send at least the current sense signal and the voltage sense signal to the communications unit which is configured to send data indicative of the current sense signal and the voltage sense signal to a remote server.

Those skilled in the art will appreciate that the operations described in connection with FIG. 5 could also be performed in a different order or selectively simultaneously.

The above description is intended by way of example only. Various modifications and structural changes may be made therein without departing from the scope of the concepts described herein and within the scope and range of equivalents of the claims.

What is claimed is:

1. A method comprising:
 generating a predetermined direct current (DC) supply voltage from power supplied by a first welding cable of a welding apparatus and a second welding cable of the welding apparatus;
 supplying the predetermined DC supply voltage to a communications unit to power the communications unit;

sensing a current being supplied by the first welding cable and the second welding cable, and generating, correspondingly, a current sense signal;

sensing a voltage between the first welding cable and the second welding cable, and generating, correspondingly, a voltage sense signal;

sending at least the current sense signal and the voltage sense signal to the communications unit; and sending, from the communications unit, data indicative of the current sense signal and the voltage sense signal to a remote server.

2. The method of claim 1, wherein generating the predetermined direct current (DC) supply voltage comprises sourcing power via at least one inductor, and the at least one inductor is configured to dampen a high frequency high voltage ignition waveform being carried by the first welding cable by no more than 50%.

3. The method of claim 1, wherein supplying the predetermined DC supply voltage to the communications unit to power the communications unit comprises powering a power storage device in the communications unit.

4. The method of claim 1, further comprising receiving a wire feeder encoder signal.

5. The method of claim 4, further comprising supplying the predetermined DC supply voltage to a wire feeder encoder signal conditioning circuit; and
operating the wire feeder encoder signal conditioning circuit to receive the wire feeder encoder signal and output a conditioned wire feeder encoder signal.

6. The method of claim 1, further comprising sending, from the communications unit, a unique identification number along with data indicative of the current sense signal and of the voltage sense signal to the remote server.

7. The method of claim 6, further comprising supplying the unique identification number to the communications unit via a mobile communications device.

8. The method of claim 1, further comprising providing the communications unit with an Internet protocol (IP) address of the remote server.

9. The method of claim 8, further comprising providing the communications unit with the Internet protocol (IP) address of the remote server via a mobile communications device.

10. The method of claim 1, further comprising automatically sending, from the communications unit, the data indicative of the current sense signal and of the voltage sense signal to the remote server, in response to completing a welding operation.

11. The method of claim 1, further comprising sending, from the communications unit, data indicative of at least one of a wire feeder type, a workpiece, or a type of joint being welded by the welding apparatus.

12. A method comprising:
generating a predetermined direct current (DC) supply voltage from power supplied by a first welding cable of a welding apparatus and a second welding cable of the welding apparatus;

supplying the predetermined DC supply voltage to a communications unit to power the communications unit;

receiving a wire feeder encoder signal;

supplying the predetermined DC supply voltage to a wire feeder encoder signal conditioning circuit;

operating the wire feeder encoder signal conditioning circuit to receive the wire feeder encoder signal and output a conditioned wire feeder encoder signal;

sending the conditioned wire feeder encoder signal to the communications unit; and sending, from the communications unit, data indicative of the conditioned wire feeder encoder signal to a remote server.

13. The method of claim 12, wherein generating the predetermined direct current (DC) supply voltage comprises sourcing power via at least one inductor, and the at least one inductor is configured to dampen a high frequency high voltage ignition waveform being carried by the first welding cable by no more than 50%.

14. The method of claim 12, wherein supplying the predetermined DC supply voltage to the communications unit to power the communications unit comprises powering a power storage device in the communications unit.

15. The method of claim 12, further comprising:
sensing a current being supplied by the first welding cable and the second welding cable, and generating, correspondingly, a current sense signal;

sensing a voltage between the first welding cable and the second welding cable, and generating, correspondingly, a voltage sense signal;

sending at least the current sense signal and the voltage sense signal to the communications unit; and sending, from the communications unit, data indicative of the current sense signal and the voltage sense signal to a remote server.

16. The method of claim 12, further comprising sending, from the communications unit, a unique identification number to the remote server.

17. The method of claim 16, further comprising supplying the unique identification number to the communications unit via a mobile communications device.

18. The method of claim 12, further comprising providing the communications unit with an Internet protocol (IP) address of the remote server.

19. The method of claim 18, further comprising providing the communications unit with the Internet protocol (IP) address of the remote server via a mobile communications device.

20. The method of claim 12, further comprising automatically sending, from the communications unit, the data indicative of the conditioned wire feeder encoder signal to the remote server, in response to completing a welding operation.

21. The method of claim 12, further comprising sending, from the communications unit, data indicative of at least one of a wire feeder type, a workpiece, or a type of joint being welded by the welding apparatus.

* * * * *